United States Patent [19]

Rim et al.

[11] Patent Number: 5,712,880
[45] Date of Patent: Jan. 27, 1998

[54] TRACEBACK-PERFORMING APPARATUS IN VITERBI DECODER

[75] Inventors: Min-joong Rim, Seoul; Young-uk Oh, Incheon, both of Rep. of Korea

[73] Assignee: Samsung Electronics Co., Ltd., Suwon, Rep. of Korea

[21] Appl. No.: 557,539

[22] Filed: Nov. 14, 1995

[30] Foreign Application Priority Data

Nov. 14, 1994 [KR] Rep. of Korea .............. 94-29806

[51] Int. Cl.$^6$ .................................................. H03D 1/00
[52] U.S. Cl. ................ 375/341; 375/262; 371/401; 371/43; 395/482; 395/494; 365/221
[58] Field of Search ............................ 375/260–262, 375/340, 341, 372; 371/30, 40.1, 43; 395/427, 481, 482, 494–496; 365/52, 189.01, 189.04, 189.05; 364/715.01, DIG. 1

[56] References Cited

U.S. PATENT DOCUMENTS

| | | | |
|---|---|---|---|
| 5,513,139 | 4/1996 | Butler | 365/189.04 |
| 5,533,065 | 7/1996 | Blaker et al. | 375/341 |
| 5,537,445 | 7/1996 | Blaker et al. | 375/341 |

Primary Examiner—Stephen Chin
Assistant Examiner—Amanda T. Le
Attorney, Agent, or Firm—Cushman Darby & Cushman Intellectual Property Group of Pillsbury Madison & Sutro LLP

[57] ABSTRACT

A traceback-performing apparatus includes a first storing portion which receives and stores new path metric values and minimum path metric value so that the first input value is output later and the later input value is output first. A first trace logic portion which receives outputs of the first storing portion and the minimum path metric value and generates a first state which is the next state to be traced. A second storing portion which receives and stores the output of the first storing portion so that the first input value is output first and the later input value is output later. A second trace logic portion which receives the output of the second storing portion and the first state and generates a second state which is the next state to be traced. And, a third storing portion which receives and stores the second state so that the first input value is output later and the later input value is output first so as to find the decoded bits. Therefore, cost is saved in embodying the Viterbi decoder in a VLSI by reducing the required chip area, simplifying address-generation and eliminating the need for global interconnection.

4 Claims, 7 Drawing Sheets

FIG. 9

```
                  MEMORY
            ┌─┬─┬─┬─┐        ┌─┬─┬─┬─┐
    TIME    │0│1│2│3│        │0│1│2│3│
            └─┴─┴─┴─┘        └─┴─┴─┴─┘
     1  PHASE 1   R             R
        PHASE 2   W             W
     2  PHASE 1     R             R
        PHASE 2     W             W
     3  PHASE 1       R             R
        PHASE 2       W             W
     4  PHASE 1         R             R
        PHASE 2         W             W
     5  PHASE 1   R                   R
        PHASE 2   W                   W
     6  PHASE 1     R             R
        PHASE 2     W             W
     7  PHASE 1       R             R
        PHASE 2       W             W
     9  PHASE 1         R       R        R : READ
        PHASE 2         W       W        W : WRITE

FIFO            LIFO
```

FIG. 10

MEMORY

| TIME | 0 | 1 | 2 | 3 | 4 | | 0 | 1 | 2 | 3 | 4 |
|---|---|---|---|---|---|---|---|---|---|---|---|
| 1 | W | R | | | | | W | R | | | |
| 2 | | W | R | | | | | W | R | | |
| 3 | | | W | R | | | | | W | R | |
| 4 | | | | W | R | | | | | W | R |
| 5 | | R | | | W | | | | | R | W |
| 6 | W | R | | | | | | | R | W | |
| 7 | | W | R | | | | | R | W | | |
| 8 | | | W | R | | | R | W | | | |

R : READ
W : WRITE

FIFO      LIFO

5,712,880

TRACEBACK-PERFORMING APPARATUS IN VITERBI DECODER

BACKGROUND OF THE INVENTION

The present invention relates to a Viterbi decoder, which is one of core parts of a forward error correction decoder, and more particularly, to a traceback-performing apparatus for memory management in the Viterbi decoder.

Recent developments in video compression technology have enabled the transmission of large quantities of video data in a narrow band and increased the importance of forward error correction, in which the correction of errors introduced to a channel is performed at a receiver's end after inserting redundant codes into a signal at a transmitter's end. Since a small error in a compressed signal can develop into a very serious one when the signal is restored, a very low bit-error rate is required for transmitting the compressed signal. Thus, the management of a memory in a traceback unit which occupies most of a chip area becomes one of the most important factors in realizing a Viterbi decoder on silicon.

Conventionally, it is problematic that an address generating process of the traceback unit for a memory bank is very complicated and a global interconnection exists which is not suitable for implementation on a very-large-scale integrated circuit (VLSI). Such problems become more serious when the memory bank is divided into many parts for reducing memory size and decoding time. If a special memory bank is added, the address generating process is simplified. However, the size of the memory increases and it is not easy to simplify the address generating process.

SUMMARY OF THE INVENTION

To solve the above problems, it is an object of the present invention to provide a traceback-performing apparatus in a Viterbi decoder suitable for embodying the VLSI implementation and simplifying a process of generating memory addresses without a global interconnection.

Accordingly, to achieve the above object, there is provided a traceback-performing apparatus, in a Viterbi decoder implemented in a VLSI, which comprises branch metric means for calculating branch metric values by receiving a bit-stream to correct errors of the bit-stream, adding-comparing-selecting means for calculating new path metric values from current path metric values corresponding to the branch metric values, minimum path metric means for calculating a minimum path metric value among the new path metric values and temporarily storing the calculated value, and traceback means for receiving the new path metric values and minimum path metric value and searching a survival path to find decoded bits, and in which a constraint length including best state detecting means for generating a current state value every uniform period is K and the size of a memory action group is L. The traceback-performing apparatus includes: first storing means for receiving and storing the new path metric values and minimum path metric value so that the first input value is output later and the later input value is output first; first trace logic means for receiving outputs of the first storing means and the minimum path metric value and generating a first state which is the next state to be traced; second storing means for receiving and storing the output of the first storing means so that the first input value is output first and the later input value is output later; second trace logic means for receiving the output of the second storing means and the first state and generating a second state which is the next state to be traced; and third storing means for receiving and storing the second state so that the first input value is output later and the later input value is output first, so as to find the decoded bits.

BRIEF DESCRIPTION OF THE DRAWINGS

The above objects and advantages of the present invention will become more apparent by describing in detail a preferred embodiment thereof with reference to the attached drawings in which:

FIG. 9 is a view explaining the address-generating of LIFO and FIFO in case of two-phase clock; and FIG. 10 is a view explaining the address-generating of LIFO and FIFO in case of single-phase clock.

DETAILED DESCRIPTION OF THE INVENTION

Before description of the present invention, the detailed construction and operation of a conventional traceback unit is explained as follows.

Figure 1:
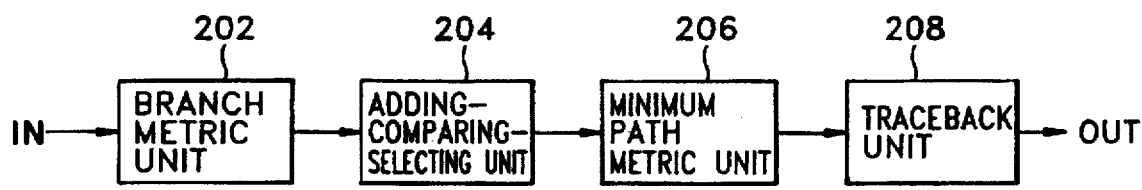
FIG. 1 is a main block diagram of a general Viterbi decoder.

The Viterbi decoder show in FIG. 1 comprises a branch metric unit 202, an adding-comparing-selecting unit 204, a minimum path metric unit 206 and a traceback unit 208.

The operation of the Viterbi decoder having such a structure will be described in detail hereinafter, referring to FIG. 1, where a constraint length is K.

Branch metric unit 202 calculates branch metrics $BM_0(t)$, $BM_1(t)$, $BM_2(t)$ and $BM_3(t)$ by receiving a pair of soft-decided p bits, $J_1$ and $J_2$, in a digital decoder (not shown). In calculating the branch metrics, each branch metric, in case that $J_1J_2$ is respectively 00, 01, 10 and 11, is shown in Equation 1, and the relationship between branch metrics is given as Equation 2.

$$00: BM_0(t)=(2^p-1-J_2)+(2^p-1-J_1)$$
$$01: BM_1(t)=(2^p-1-J_2)+J_1$$
$$10: BM_2(t)=J_2+(2^p-1-J_1)$$
$$11: BM_3(t)=J_2+J_1 \qquad (1)$$

$$BM_3(t)=2^{p+1}-2-BM_0(t)$$

$$BM_2(t)=2^{P+1}-2-BM_1(t) \qquad (2)$$

When the calculation of each branch metric is completed, adding-comparing-selecting unit 204 calculates a new path metric by making use of the four branch metrics and a current path metric. Here, the number of the path metric ($PM_n$) is determined by Equation 3 according to the constraint length (K) or the memory number (M) of the convolution code.

$$PM_n=2^{K-1}-2^M \qquad (3)$$

When the calculation of the path metric is completed, minimum path metric unit 206 calculates a minimum path metric value by using the calculated path metric value. Traceback unit 208 stores $2^{K-1}$ bits data from adding-comparing-selecting unit 204 and minimum path from minimum path metric unit 206, searches a survival path by making use of the stored data, stores the searched survival path, and searches the information bits decoded by tracing back. That is, traceback unit 208 functions to read/write data in a memory. Then, the memory of traceback unit 208 determines the cost for implementing the decoder in the VLSI circuit.

Briefly, traceback unit 208 mainly reads/writes data in a memory. The present invention is for the memory management of traceback unit 208 in the Viterbi decoder operating at high speed (50 Mbps or more). The followings are a few assumptions for the easy description of the present invention.

1) The Viterbi decoder provides one output per clock cycle.
2) Each one time of reading and writing occurs in a single memory during one clock cycle.
3) The input and output bandwidths in a RAM are equal to each other.

Figure 2:
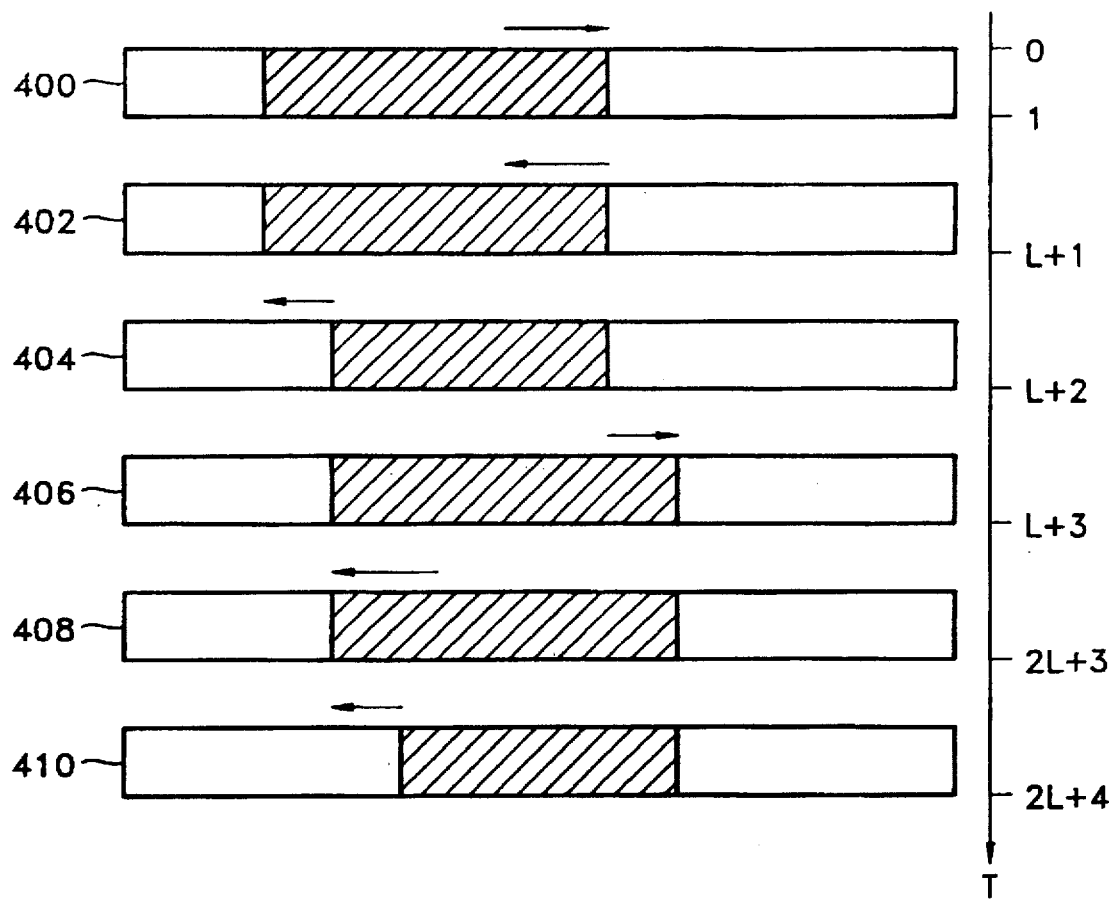
FIG. 2 is a view illustrating the process of a storing action for explaining the process of low-speed traceback operation in the Viterbi decoder shown in FIG. 1.

In FIG. 2, the hatched sections indicate areas where data is stored in memory, the vertical axis of memory rows 400, 402, 404, 406, 468 and 410 represents the elapsed time, horizontal axes thereof each represent the state (S) of $2^{K-1}$ and the arrows signify the data-storing direction. The traceback performing proceeds from memory rows 400 to 410 and memory rows 400, 402, 404, 406, 408 and 410 indicate one-time writing, one-time tracing back, one-time decoding, one-time writing, one-time tracing back and one-time decoding, respectively.

On the above-described supposition, the traceback performing process of traceback unit 208 in the low-speed Viterbi decoder will be described in detail, referring to FIG. 2.

Primarily, the basic operations for traceback performing process in the low-speed Viterbi decoder having traceback depth L are defined as follows.

Operation 1: writing: an operation of writing data from minimum path metric unit 206 in a memory.

Operation 2: traceback: an operation of generating the next state address from the data read from the memory and a current state address. The original state address is externally given.

Operation 3: decoding: the same operation as the traceback except for outputting the decoded results.

After writing is performed in order to store data provided from minimum path metric unit 206 (400 in FIG. 2), L-times tracebacks are performed by using the L stored data and the externally given state address (402). Then, after obtained results are decoded by using the oldest data (404), the stored data is deleted from the memory.

Memory rows 406, 408 and 410 show repetition of such operations.

Figure 3:
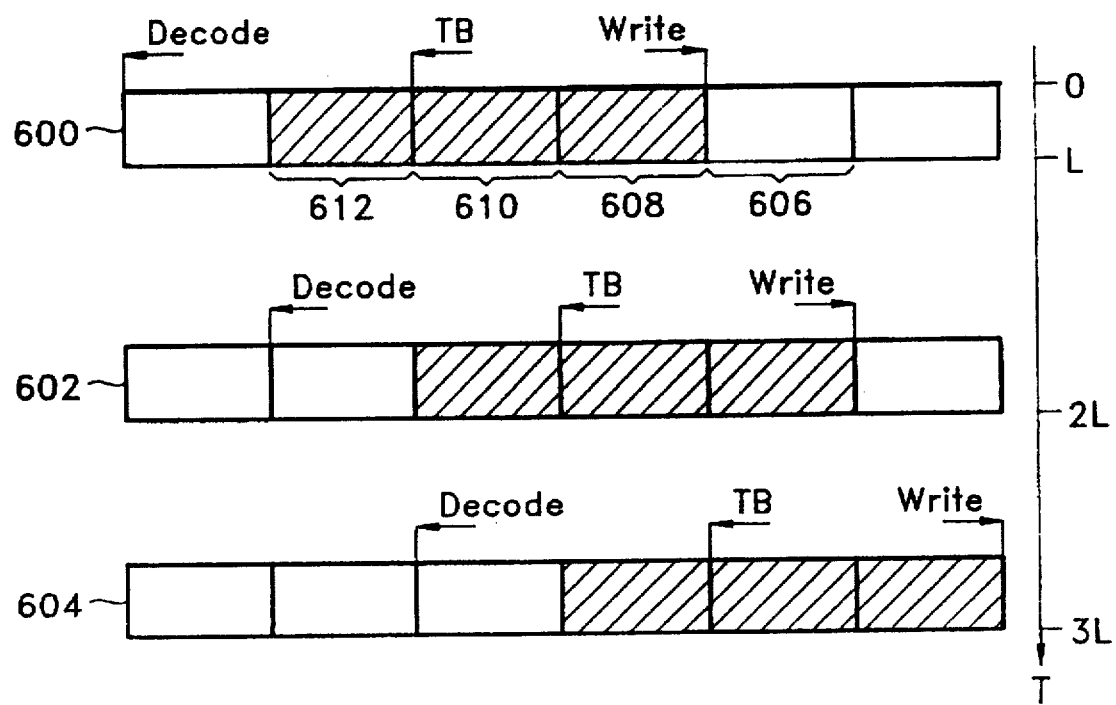
FIG. 3 is a view illustrating the process of a storing action for explaining the process of high-speed traceback operation in the Viterbi decoder shown in FIG. 1.

In FIG. 3, the vertical axis represents the elapsed time (T) and each horizontal axis represents the status state (S) of a memory. The arrows show the directions in which the operations are performed. Each memory bank is composed of a plurality of sub-memory banks. Each sub-memory bank has L words, one word being composed of $2^{K-1}$ bits.

Referring to FIG. 3, the traceback performing process in a general high-speed Viterbi decoder will be described hereinafter.

The traceback performing process in the low-speed Viterbi decoder of FIG. 2 cannot provide one output per one clock since too many memory operations are needed to provide the one output. For reducing memory operations, as shown in FIG. 3, the high-speed Viterbi decoder performs one-time traceback process (L tracebacks) every output (L outputs) of one block, the L operations being formed as a group. At memory row 600 in FIG. 3, L times writings (608), L times tracebacks (610) and then L times decodings (612) are performed. As a result, L writings, L tracebacks and L decodings to L outputs are made so that one-time writing, traceback and decoding to one output are made on an average respectively. Reference numerals 602 and 604 show the simultaneous performance of writing, traceback and decoding to provide one output per clock cycle in subsequent clocks.

Figure 4:
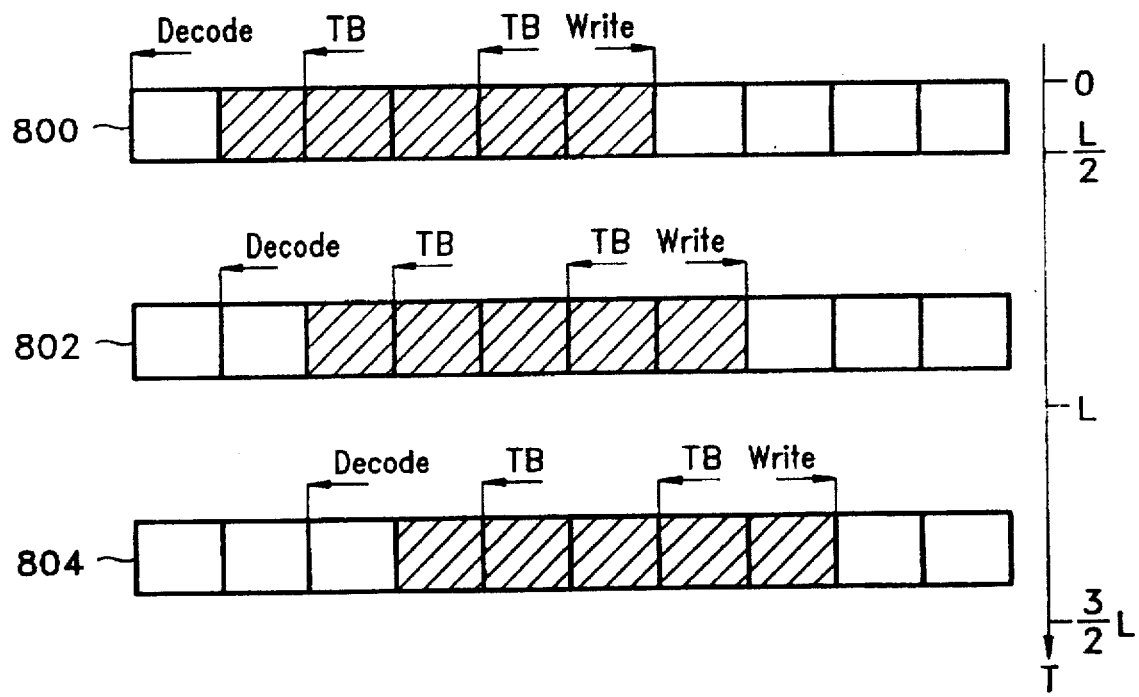
FIG. 4 is a view illustrating the process of the storing action for describing a traceback performing process when the sizes of a memory action group and a memory bank in the conventional high-speed Viterbi decoder shown in FIG. 3 reduce to half (L/2)

In case of reducing the memory bank size as shown in FIG. 4, the memory requirement and decoding delay are described as follows.

The traceback performing process shown in FIG. 3 can be embodied with three memory banks, since the writing and decoding can be performed sharing one memory bank. The size of the memory is 3L words excluding a last-in-first-out (LIFO) buffer and the size of the decoding delay including a buffer is 4L. The size of the memory action and decoding delay can be reduced by diminishing the size of the memory action group. When reducing the size of memory operation group, the number of memory operations increases. However, by increasing the number of the memory banks and diminishing their size, that is, increasing parallelism, the same speed can be maintained. When the memory bank size is reduced, two traceback pointers (each pointer points the memory address to be accessed by tracing back) are required, so that parallelism increases and the increased number of memory operations is compensated.

In FIG. 4, the memory requirement and decoding delay are 5L/2 and 3L, respectively. When the memory bank size is L/n, the memory requirement is (2n+1)L/n and the decoding delay is 2(n+1)L/n. As n increases, the memory requirement and decoding delay are decreased but the indirect cost for implementing hardware increases since the memory is divided into small pieces.

Figure 5:
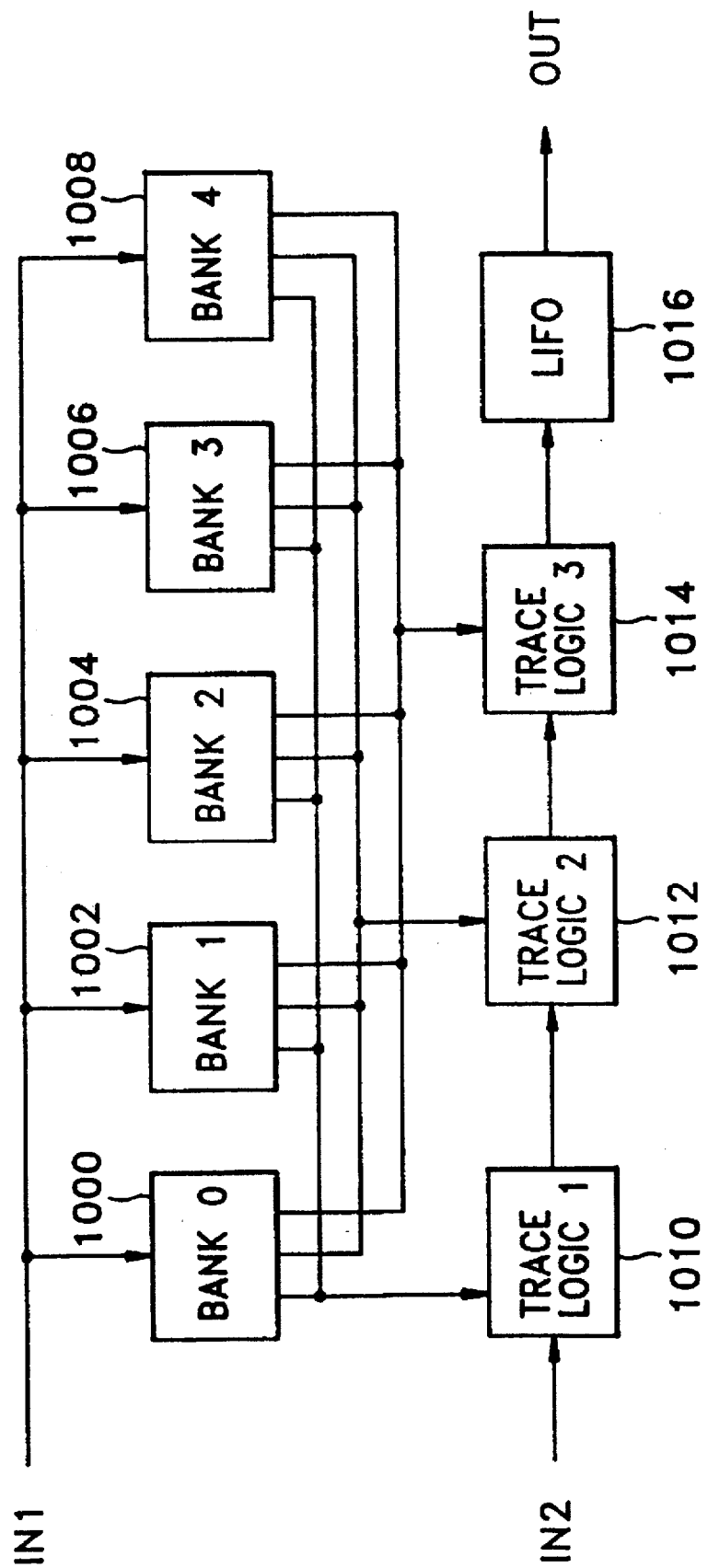
FIG. 5 is a detailed block diagram illustrating a conventional traceback unit for performing the traceback operation shown in FIG. 4.

A conventional traceback unit 208 shown in FIG. 5 comprises a first memory bank 1000, a second memory bank 1002, a third memory 1004, a fourth memory bank 1006, a fifth memory bank 1008, a first trace logic 1010, a second trace logic 1012, a third trace logic 1014 and a LIFO 1016.

Figure 6:
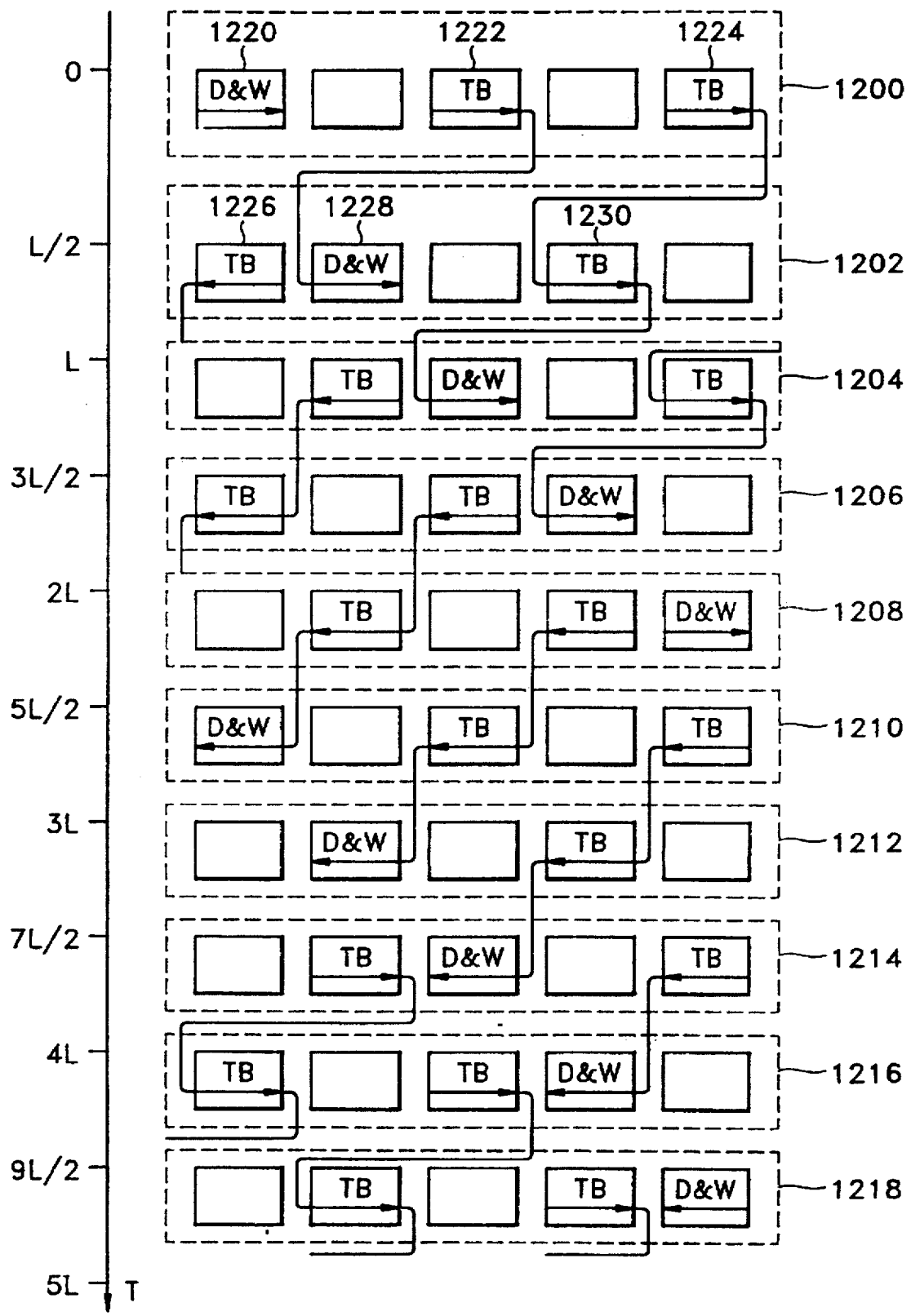
FIG. 6 is a view explaining a method of designating addresses of the memory banks shown in FIG. 5.

In FIG. 6, vertical and horizontal axes indicate time (T) and state (S), respectively. Each row is composed of five memory banks, and D & W and TB signify decoding & writing and traceback operation, respectively.

Referring to FIGS. 5 and 6, problems will be described hereunder when low-, high- and converted high-speed Viterbi decoders for performing the traceback are implemented in a VLSI circuit.

Since $2^{K-1}$ bits information must be input in order from adding-comparing-selecting unit 204 shown in FIG. 1 to all memory banks via an input port IN1 shown in FIG. 5, all memory banks should be connected by a bus. When K=7, it is a problem that a 64-bit bus connects various parts of a chip. Trace logic 1 1010 and trace logic 2 1012 are for performing the traceback and traceback logic 3 1014 is for decoding. LIFO 1016 reverses the output order of trace logic 3 1014 to be upright and then the decoded information bits are output via an output port OUT.

To read and write data using the five memory banks shown in FIG. 5, the banks should be designated. The method of designating these banks will be described referring to FIG. 6.

Memory rows 1200, 1202, 1204, 1206, 1208, 1210, 1212, 1214, 1216 and 1218 in FIG. 6 each show how addresses change in the five banks. In the case of first row 1200, decoding and writing are performed from left to right at a first bank 1220. At third and fifth banks 1222 and 1224, traceback is performed from left to right. However, nothing happens at second and fourth banks. In performing first row 1200, clock time as much as L/2 is required.

Second row 1202 shows an address change during the next L/2 clock. In this case the traceback is performed from right to left at first bank 1226. That is, the address diminishes by one per clock. At second and fourth banks 1228 and 1230, decoding & writing and traceback are performed, respectively. At third and fifth banks, operations halt. A period of generating address in such manners is 5L. FIG. 6 shows the address-generating during a single period. Each bank should do various operations according to time and to generate these memory addresses are not easy. Also, an address for the LIFO in FIG. 5 should be generated.

In the conventional traceback unit, the reason why the memory address generating process is complicated and a global interconnection exists is that the role of each memory bank continuously changes. Accordingly, the traceback performing apparatus according to the present invention is differentiated from the conventional apparatus, in that the role of the memory bank is fixed and data is transferred along the memory banks.

So far, while the operation of the conventional traceback unit was explained, the structure and operation of a Viterbi decoder of the present invention will be now described in detail referring to the attached drawings.

Figure 7:
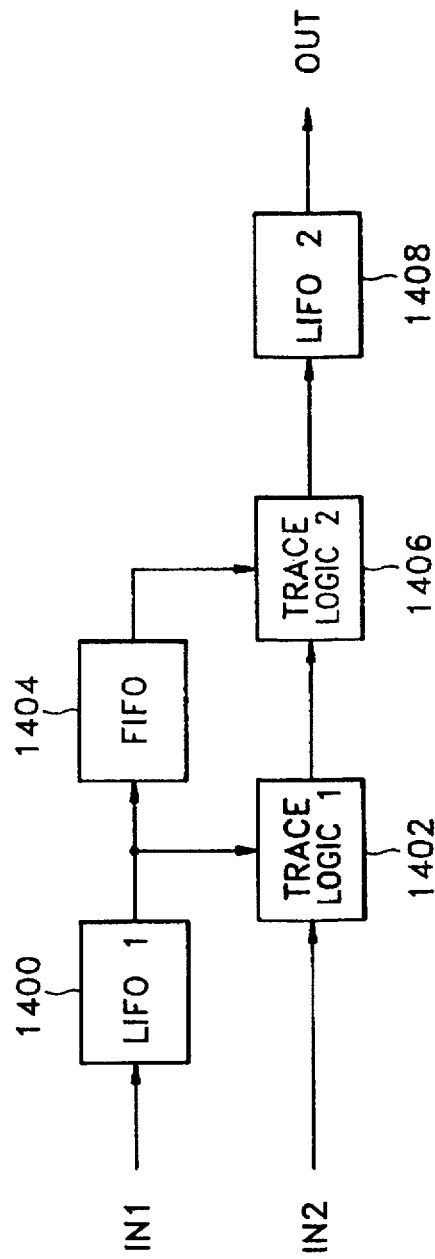
FIG. 7 is a detailed block diagram of a traceback unit of the present invention, when the size of the memory action group is L.

The traceback unit of the present invention shown in FIG. 7, comprises a first LIFO 1400, a first trace logic 1402, a FIFO 1404, a second trace logic 1406 and a second LIFO 1408.

Figure 8:
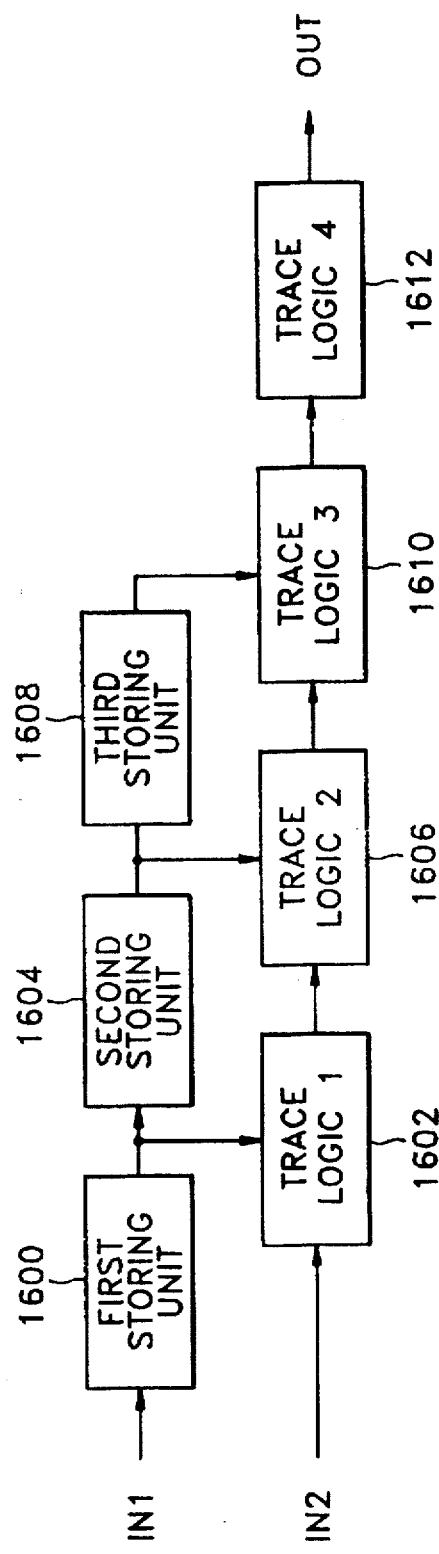
FIG. 8 is a detailed block diagram of the traceback unit of the present invention, when the size of the memory action group is L/2.

The traceback unit shown in FIG. 8 comprises a first storing unit 1600, a first trace logic unit 1602, a second storing unit 1604, a second trace logic unit 1606, a third storing unit 1608, a third trace logic unit 1610 and a fourth storing unit 1612.

In FIGS. 7 and 8, the FIFO and LIFO are assumed to use a dual-port RAM, and in this case, performing simultaneously one-time reading and one-time writing at a single clock is available according to the assumption.

Primarily, when the size of the memory action group is L, the operation of the traceback having the above structure will be described as follows, with reference to FIG. 7.

The data generated from adding-comparing-selecting unit 204 of FIG. 1 is input through input port IN1 of the first LIFO 1400 shown in FIG. 7 to be reversed in order and then output to FIFO 1404 and the first trace logic 1402. The first trace logic 1402 receives an output of the first LIFO 1400 and a current state through IN2 to perform traceback operation and generates a first state. FIFO 1404 receives and decodes an output of the first LIFO 1400 and provides the result to the second trace logic 1406. The second trace logic 1406 receives outputs of FIFO 1404 and the first trace logic 1402 and outputs a second state. The second LIFO 1408 receives the second state and generates information bits in which errors are corrected through a single bus line.

When the size of the memory action group is L/2 and the constraint length is K, the $2^{K-1}$ bit information transmitted from the adding-comparing-selecting unit 204 is stored in a first storing unit 1600 via an input port IN1. The sequence of the information is reversed by the first storing unit 1600 which can be embodied as a memory for performing a LIFO operation, is transmitted to a second storing unit 1604 which can be embodied as a memory for performing the following FIFO operation and simultaneously, input to a first trace logic unit 1602. The first trace logic unit 1602 calculates the following state every uniform period by using the data provided from the first storing unit 1600 and a current state value received via IN2 from a best state detection unit (not shown).

Here, the inputs and the outputs of the first trace logic unit 1602 and second trace logic unit 1606 and the input of third trace logic unit 1610 are K−1 bits, respectively. The output of the second storing unit 1604 is transmitted to the third storing unit 1608 which can be embodied as a memory for performing a FIFO operation, and simultaneously, the second trace logic unit 1606 performs the traceback operation.

The third trace logic unit 1610 outputs a third state by receiving outputs of the third storing unit 1608 and the second trace logic unit 1606.

The fourth storing unit 1612, which can be embodied as a memory for performing a LIFO operation by receiving the output of the third trace logic unit 1610, completes the decoding by rectifying the sequence of the input bits. The fourth storing unit 1612 comprises a RAM having one-bit of information, the number of which is L/2+1.

As shown in FIGS. 9 and 10, the address-generating of LIFO and FIFO are very simple. That is, in the case of the FIFO, a value of a counter simply increases while having a modulo concept in which zero follows the maximum value continuously. In the case of the LIFO, when the value of the counter reaches the maximum value, the value starts to decrease, and when the decreasing value reaches the minimum value, the value starts to increase again.

As described above, the traceback unit according to the present invention, while using the same amount of memory and requiring the same trace logic as the conventional traceback unit, has effects of saving cost in implementing the Viterbi decoder in a VLSI by totally reducing a chip area and making the implementation in the VLSI circuit simple and easy, since the address-generating for a memory is simple and global interconnection is not required.

What is claimed is:

1. A traceback-performing apparatus in a Viterbi decoder implemented in a VLSI which comprises branch metric means for calculating branch metric values by receiving a bit-stream to correct errors of the bit-stream, adding-comparing-selecting means for calculating new path metric values from current path metric values corresponding to the branch metric values, minimum path metric means for calculating a minimum path metric value among the new path metric values and temporarily storing the calculated value, and traceback means for receiving said new path metric values and minimum path metric value and searching a survival path to find decoded bits, and in which a constraint length is K, the size of a memory action group is L, where K and L are positive integers, and best state detecting means generates a current state value every uniform period, said traceback means comprising:

first storing means for receiving and storing said new path metric values and minimum path metric value so that the first input value is output later and the later input value is output first;

first trace logic means for receiving outputs of said first storing means and said current state value and generating a first state which is the next state to be traced;

second storing means for receiving and storing the output of said first storing means so that the first input value is output first and the later input value is output later;

second trace logic means for receiving the output of said second storing means and the first state and generating a second state which is the next state to be traced; and third storing means for receiving and storing the second state so that the first input value is output later and the later input value is output first, so as to find the decoded bits.

2. A traceback-performing apparatus in a Viterbi decoder implemented in a VLSI which comprises branch metric means for calculating branch metric values by receiving a bit-stream to correct errors of the bit-stream, adding-comparing-selecting means for calculating new path metric values from current path metric values corresponding to the branch metric values, minimum path metric means for calculating a minimum path metric value among the new path metric values and temporarily storing the calculated value, and traceback means for receiving said new path metric values and minimum metric value and searching a survival path to find decoded bits, and in which a constraint length is K, the size of a memory action group is L/2, where K and L are positive integers, and best state detecting means generates a current state value every uniform period, said traceback means comprising:

first storing means for receiving and storing said new path metric values and minimum path metric value so that the first input value is output later and the later input value is output first;

first trace logic means for receiving outputs of said first storing means and said current state value and generating a first state which is the next state to be traced;

second storing means for receiving and storing the output of said first storing means so that the first input value is output first and the later input value is output later;

second trace logic means for receiving the output of said second storing means and the first state and generating a second state which is the next state to be traced;

third storing means for receiving and storing the output of said second storing means so that the first input value is output first and the later input value is output later;

third trace logic means for receiving the output of said third storing means and the second state, and generating a third state which is the next state to be traced; and fourth storing means for receiving and storing the third state so that the first input is output later and the later input is output first, so as to find the decoded bits.

3. A method of performing traceback in a Viterbi decoder implemented in a VLSI which comprises branch metric means for calculating branch metric values by receiving a bit-stream to correct errors of the bit-stream, adding-comparing-selecting means for calculating new path metric values from current path metric values corresponding to the branch metric values, minimum path metric means for calculating a minimum path metric value among the new path metric values and temporarily storing the calculated value, and traceback means for receiving said new path metric values and minimum path metric value and searching a survival path to find decoded bits, and in which a constraint length is K, the size of a memory action group is L, where K and L are positive integers, and best state detecting means generates a current state value every uniform period, the method comprising the steps of:

receiving and storing said new path metric values and minimum path metric value in a first storing means so that the first input value is output later and the later input value is output first;

receiving outputs of said first storing means and said current state value at a first trace logic means and generating a first state which is the next state to be traced;

receiving and storing the output of said first storing means in a second storing means so that the first input value is output first and the later input value is output later;

receiving the output of said second storing means and the first state and at a second trace logic means generating a second state which is the next state to be traced; and receiving and storing the second state in a third storing means so that the first input value is output later and the later input value is output first, so as to find the decoded bits.

4. A method of performing traceback in a Viterbi decoder implemented in a VLSI which comprises branch metric means for calculating branch metric values by receiving a bit-stream to correct errors of the bit-stream, adding-comparing-selecting means for calculating new path metric values from current path metric values corresponding to the branch metric values, minimum path metric means calculating a minimum path metric value among the new path metric values and temporarily storing the calculated value, and traceback means for receiving said new path metric values and minimum metric value and searching a survival path to find decoded bits, and in which a constraint length is K, the size of a memory action group is L/2, where K and L are positive integers, and best state detecting means generates a current state value every uniform period, the method comprising the steps of:

receiving and storing said new path metric values and minimum path metric value in a first storing means so that the first input value is output later and the later input value is output first;

receiving outputs of said first storing means and said current state value at a first trace logic means and generating a first state which is the next state to be traced;

receiving and storing the output of said first storing means in a second storing means so that the first input value is output first and the later input value is output later;

receiving the output of said second storing means and the first state at a second trace logic means and generating a second state which is the next state to be traced;

receiving and storing the output of said second storing means in a third storing means so that the first input value is output first and the later input value is output later;

receiving the output of said third storing means and the second state, at a third trace logic means and generating a third state which is the next state to be traced; and receiving and storing the third state in a fourth storing means so that the first input is output later and the later input is output first, so as to find the decoded bits.

* * * * *